(12) United States Patent
Hsu et al.

(10) Patent No.: US 11,335,589 B2
(45) Date of Patent: May 17, 2022

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Yao-Wen Hsu, New Taipei (TW); Ming-Che Ku, Hsinchu (TW); Neng-Jye Yang, Hsinchu (TW); Yu-Wen Wang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/901,757

(22) Filed: Jun. 15, 2020

(65) Prior Publication Data

US 2020/0312711 A1 Oct. 1, 2020

Related U.S. Application Data

(63) Continuation of application No. 15/897,532, filed on Feb. 15, 2018, now Pat. No. 10,685,870.

(60) Provisional application No. 62/551,857, filed on Aug. 30, 2017.

(51) Int. Cl.
*H01L 21/768* (2006.01)
*H01L 21/02* (2006.01)

(52) U.S. Cl.
CPC .. *H01L 21/76814* (2013.01); *H01L 21/02063* (2013.01); *H01L 21/76813* (2013.01); *H01L 21/76843* (2013.01); *H01L 21/76877* (2013.01)

(58) Field of Classification Search
CPC ......... H01L 21/76814; H01L 21/76813; H01L 21/02063; H01L 21/76877; H01L 21/76843; H01L 21/0206; C23C 14/021; C23C 14/022
See application file for complete search history.

(56) References Cited

U.S. PATENT DOCUMENTS

| | | | |
|---|---|---|---|
| 6,717,267 B1 | 4/2004 | Kunikiyo | |
| 6,903,015 B2 | 6/2005 | Matsui et al. | |
| 7,435,676 B2 | 10/2008 | Dalton et al. | |
| 8,207,060 B2 | 6/2012 | Yang | |
| 10,062,641 B2 | 8/2018 | Sheng et al. | |
| 2003/0186544 A1 | 10/2003 | Matsui et al. | |
| 2004/0150103 A1 | 8/2004 | Cooney, III et al. | |
| 2004/0177655 A1 | 9/2004 | Kodera et al. | |
| 2005/0148176 A1 | 7/2005 | Matsui et al. | |

(Continued)

FOREIGN PATENT DOCUMENTS

| | | |
|---|---|---|
| CN | 1444259 A | 9/2003 |
| CN | 101903990 A | 12/2010 |

(Continued)

*Primary Examiner* — Latanya N Crawford Eason
(74) *Attorney, Agent, or Firm* — Slater Matsil, LLP (57) ABSTRACT

An opening is formed within a dielectric material overlying a semiconductor substrate. The opening may comprise a via portion and a trench portion. During the manufacturing process a treatment chemical is placed into contact with the exposed surfaces in order to release charges that have built up on the surfaces. By releasing the charges, a surface change potential difference is reduced, helping to prevent galvanic corrosion from occurring during further manufacturing.

20 Claims, 5 Drawing Sheets

(56) References Cited

U.S. PATENT DOCUMENTS

| | | |
|---|---|---|
| 2005/0194689 A1 | 9/2005 | Chapple-Sokol et al. |
| 2006/0118962 A1* | 6/2006 | Huang .............. H01L 21/76838 257/760 |
| 2008/0057705 A1 | 3/2008 | Feustel et al. |
| 2010/0055897 A1* | 3/2010 | Chou .................. C11D 7/5004 438/638 |
| 2012/0112347 A1* | 5/2012 | Eckhardt ................. H01L 24/82 257/751 |
| 2013/0200040 A1 | 8/2013 | Fitzsimmons et al. |
| 2015/0076625 A1 | 3/2015 | Noguchi et al. |
| 2016/0254185 A1 | 9/2016 | Ryan et al. |
| 2018/0005874 A1* | 1/2018 | Mignot ............. H01L 21/76811 |
| 2018/0350634 A1 | 12/2018 | Li et al. |
| 2018/0350664 A1 | 12/2018 | Chen et al. |

FOREIGN PATENT DOCUMENTS

| | | |
|---|---|---|
| JP | 2006100307 A | 4/2006 |
| KR | 20040081352 A | 9/2004 |
| TW | 472309 B | 1/2002 |
| TW | 507280 B | 10/2002 |
| TW | 200416953 A | 9/2004 |
| TW | 200425329 A | 11/2004 |
| TW | 200729404 A | 8/2007 |
| TW | 200837825 A | 9/2008 |

\* cited by examiner

SEMICONDUCTOR DEVICE AND METHOD OF MANUFACTURE

PRIORITY CLAIM AND CROSS-REFERENCE

This application is a continuation of U.S. patent application Ser. No. 15/897,532, filed on Feb. 15, 2018, and entitled "Semiconductor Device and Method of Manufacture," which claims the benefit to U.S. Provisional Patent Application No. 62/551,857, filed on Aug. 30, 2017, and entitled "Semiconductor Device and Method of Manufacture," which applications are incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
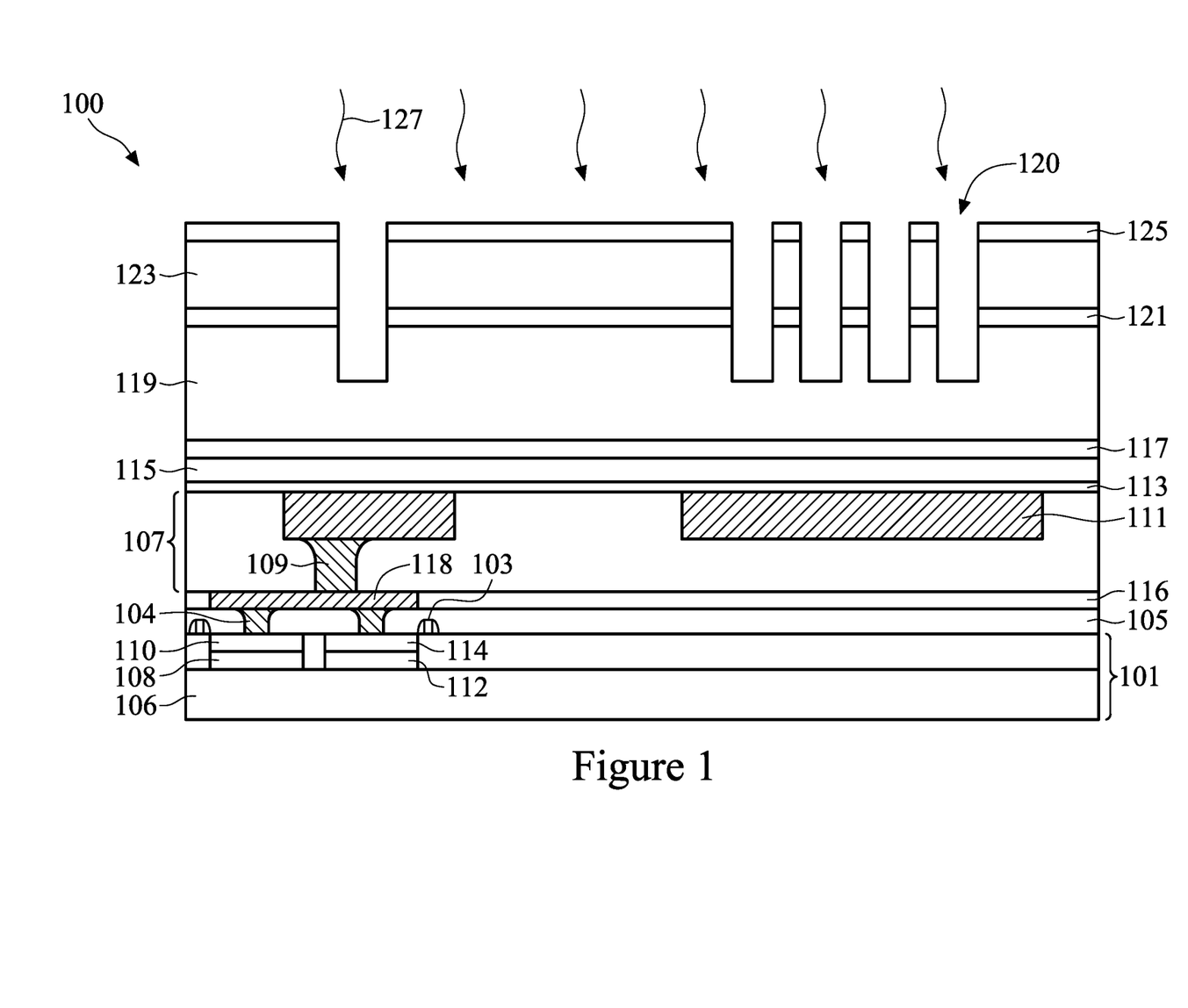
FIG. 1 illustrates a formation of via openings in accordance with some embodiments.

With reference now to FIG. 1, FIG. 1 illustrates an intermediate manufacture of a semiconductor device 100, wherein the semiconductor device 100 comprises a semiconductor substrate 101, active devices 103 within an active region (or oxide definition (OD) region) of the semiconductor substrate 101, an interlayer dielectric layer 105 over the active devices 103, contact plugs 104, a first dielectric layer 116, a contact plug trench 118, a second dielectric layer 107, and a first via 109 and a first trench 111 located within the second dielectric layer 107. In some embodiments, the semiconductor substrate 101 comprises a bulk material 106, a first well 108 (e.g., a p-well), and a first conductive region 110 (an n-region). In an embodiment the bulk material 106 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first well 108 in some embodiments may be a deep well, such as a p-well. For example, the first well 108 may comprise dopants which impart a first conductivity to the semiconductor substrate 101 within the first well 108. The dopants may be implanted using, e.g., an ion implantation process. However, any suitable implantation may be utilized.

The first conductive region 110 is utilized in conjunction with the first well 108 to provide a suitable functionality. For example, in one embodiment the first conductive region 110 and the first well 108 form a first photodiode (which may have associated transistors which are not separately illustrated) within the semiconductor substrate 101, although any other suitable functionalities, such as a source/drain region for a transistor (either planar or finFET), may also be utilized. In some embodiments the first conductive region 110 is epitaxially grown on either the bulk material 106 (if the first well 108 has not yet been formed) or on the first well 108 (if the first well 108 has been formed). Additionally, the first conductive region 110 may have dopants of a different conductivity than the first well 108, such as by being an n-type region, and the dopants may be placed either in situ during the growth of the first conductive region 110 or else implanted after the growth of the material of the first conductive region 110.

Additionally, the semiconductor substrate 101 may also include a second well 112 and a second conductive region 114 over the bulk material 106. In an embodiment the second well 112 may be similar to the first well 108, but with an opposite conductivity (e.g., may be an n-well instead of a p-well), while the second conductive region 114 may be similar to the first conductive region 110, but with an opposite conductivity (e.g., may be a p-epitaxial region instead of an n-epitaxial region). However, any suitable wells and epitaxial regions may be utilized.

Additionally, the semiconductor substrate 101 may include active devices 103. While only a few active devices 103 are illustrated in FIG. 1, this is intended to illustrative only, as many active devices 103 are utilized in order to achieve the desired functionality of the overall device. As one of ordinary skill in the art will recognize, a wide variety of active devices and passive devices such as transistors, capacitors, resistors, combinations of these, and the like may be used to generate the desired structural and functional requirements of the design for the semiconductor device 100. The active devices 103 may be formed using any suitable methods.

For example, in some embodiments the active devices 103 may be finFET devices, wherein fins of semiconductor materials are formed with gate stacks over the finFET devices in order to form channels. Once the gate stacks have been formed, portions of the fins of semiconductor materials that are uncovered by the gate stack may be removed, and source/drain regions (e.g., the first conductive region 110 or the second conductive region 114) may be regrown. For clarity, FIG. 1 only illustrates the active devices as a first gate stack adjacent to the first conductive region 110 (with the understanding that there is another source/drain region that is not illustrated on an opposite side of the gate stack) and a second gate stack adjacent to the second conductive region 114 (again with the understanding that there is another source/drain region that is not illustrated on an opposite side of the second gate stack).

The interlayer dielectric layer 105 is formed over the active devices 103 in order to protect and isolate the active devices 103. In an embodiment the interlayer dielectric layer 105 may comprise a material such as boron phosphorous silicate glass (BPSG), although any suitable dielectrics may be used for either layer. The interlayer dielectric layer 105 may be formed using a process such as PECVD, although other processes, such as LPCVD, may alternatively be used. The interlayer dielectric layer 105 may be formed to a thickness of between about 100 Å and about 3,000 Å.

Once the interlayer dielectric layer 105 has been formed, contact plugs 104 may be formed through the interlayer dielectric layer 105 to electrically connect the active devices 103 with the overlying structures. In an embodiment the formation of the contact plugs 104 may be initiated by first forming contact plug openings through the interlayer dielectric layer to expose a conductive portion of the active devices 103. In an embodiment the contact plug openings may be formed using a suitable photolithographic masking and etching process.

Once the contact plug openings have been formed, a formation of a first glue layer (not separately illustrated in FIG. 1) may be initiated. In an embodiment the first glue layer is utilized to help adhere the rest of the contact plugs 104 to the underlying structure and may be, e.g., tungsten, titanium nitride, tantalum nitride, or the like formed using a process such as CVD, plasma enhanced chemical vapor deposition (PECVD), physical vapor deposition (PVD), atomic layer deposition (ALD), and the like or the like.

Once the first glue layer has been formed, the remainder of the contact plugs 104 is formed in contact with the glue layer. In an embodiment the material of the contact plugs 104 is tungsten (W), although any other suitable material, such as aluminum, copper, combinations of these, or the like, may be utilized. The material of the contact plugs 104 may be formed using a process such as CVD, although any suitable process, such as PECVD, physical vapor deposition (PVD), atomic layer deposition (ALD), and the like, may be utilized.

Once filled, a planarization of the contact plugs 104 is performed such that the material of the contact plugs 104 that is outside of the interlayer dielectric layer 105 is removed, forming the contact plugs 104 (one of which is illustrated in FIG. 1). In an embodiment the planarization process is a chemical mechanical polish (CMP), in which a combination of etching materials and abrading materials are put into contact with the material of the contact plugs 104 and a grinding pad (not separately illustrated) is used to grind away the material of the contact plugs 104 until all of the material of the contact plugs 104 over the interlayer dielectric layer 105 has been removed.

The first dielectric layer 116 may be formed over the interlayer dielectric layer 105. The first dielectric layer 116 may be made of one or more suitable dielectric materials such as low-k dielectrics such as carbon doped oxides, extremely low-k dielectrics such as porous carbon doped silicon dioxide, silicon oxide, silicon nitride, a polymer such as polyimide, combinations of these, or the like. The first dielectric layer 116 may be formed through a process such as a spin-on process or a chemical vapor deposition (CVD), although any suitable process may be utilized, and may have a thickness of between about 400 Å and about 1000 Å, such as about 600 Å.

Once the first dielectric layer 116 has been formed, a contact plug trench 118 may be formed to connect the contact plugs 104 to overlying metallization layers and, in some embodiments, each other. In an embodiment the contact plug trench 118 may be formed using a damascene process, whereby an opening is formed within the first dielectric layer 116 to expose the contact plugs 104, and the opening is then filled with a conductive material. Alternatively, the contact plug trench 118 and the contact plugs 104 may be formed simultaneously using, e.g., a dual damascene process. Any suitable method of manufacturing the contact plugs 104 and the contact plug trench 118 may be utilized.

The second dielectric layer 107 may be formed over the first dielectric layer 116. The second dielectric layer 107 may be made of one or more suitable dielectric materials such as low-k dielectrics such as carbon doped oxides, extremely low-k dielectrics such as porous carbon doped silicon dioxide, silicon oxide, silicon nitride, a polymer such as polyimide, combinations of these, or the like. The second dielectric layer 107 may be formed through a process such as a spin-on process or a chemical vapor deposition (CVD), although any suitable process may be utilized, and may have a thickness of between about 400 Å and about 1000 Å, such as about 600 Å.

FIG. 1 additionally illustrates a formation of a first via 109 and the first trench 111 within the second dielectric layer 107. In an embodiment the first via 109 and the first trench 111 may be formed using, e.g., a dual damascene process, whereby an opening for both the first via 109 and the first trench 111 is first formed within the second dielectric layer 107. In an embodiment the opening may be formed by placing and patterning a photoresist material over the second dielectric layer 107. Once the photoresist material has been placed and patterned, a dry etch process such as a reactive ion etch may be utilized to transfer the pattern from the patterned photoresist to the underlying second dielectric layer 107. This process may be repeated to form both the via portion of the opening and the trench portion of the opening.

Once the opening has been formed, the opening may be filled with a conductive material in order to form the first via 109 and the first trench 111 within the second dielectric layer 107. In an embodiment the formation of the conductive material may be initiated by first depositing a barrier layer (not separately illustrated in FIG. 1). The barrier layer may be a barrier material such as titanium nitride or tantalum nitride which may be deposited using a deposition process such as chemical vapor deposition, physical vapor deposition, atomic layer deposition, or the like. However, any suitable material or method of deposition may be utilized to form the barrier layer.

Once the barrier layer has been formed, a conductive material may be deposited to fill and/or overfill the openings within the second dielectric layer 107. In an embodiment the conductive material may be a material such as copper, tungsten, ruthenium, titanium dioxide, combinations of these, or the like, formed, e.g., using a seed layer (not shown) and a plating process, such as electrochemical plating, although other processes of formation, such as sputtering, evaporation, or a PECVD process, may alternatively be used depending upon the desired materials. Once the openings have been filled with conductive material, any excess conductive material outside of the openings may be removed, and the first trench 111 and the second dielectric layer 107 may be planarized using, for example, a chemical mechanical polishing process.

FIG. 1 also illustrates the beginning process for the formation of another metallization layer (over the metallization layer formed by the first via 109 and the first trench 111). In an embodiment a first etch stop layer 113, a second etch stop layer 115, a third etch stop layer 117, and a third dielectric layer 119 are formed over the second dielectric layer 107.

The first etch stop layer 113 is used to protect the underlying structures and provide a control point for a subsequent etching process through, e.g., the second etch stop layer 115. In one embodiment, the first etch stop layer 113 may be formed of aluminum nitride (AlN) using plasma enhanced chemical vapor deposition (PECVD), although other materials such as nitrides, carbides, borides, combinations thereof, or the like, and techniques of forming the first etch stop layer 113, such as low pressure CVD (LPCVD), PVD, or the like, could be used. The first etch stop layer 113 may have a thickness of between about 50 Å and about 2,000 Å, such as about 200 Å.

Once the first etch stop layer 113 has been formed to cover the second dielectric layer 107, the second etch stop layer 115 is formed over the first etch stop layer 113. In an embodiment the second etch stop layer 115 is formed of a material such as a carbon doped oxide such as SiOC, although any other suitable material may also be used. The material of the second etch stop layer 115 may be formed using a deposition process such as chemical vapor deposition, physical vapor deposition, atomic layer deposition, or the like, and may be deposited to a thickness of between about 10 Å and about 200 Å, such as about 40 Å. However, any suitable process of formation and thickness may be utilized.

Once the second etch stop layer 115 has been formed, the third etch stop layer 117 is formed over the second etch stop layer 115. In an embodiment the third etch stop layer 117 is formed of a material such as aluminum oxide, although any suitable material, such as aluminum nitride, may also be used. The material of the third etch stop layer 117 may be formed using a deposition process such as chemical vapor deposition, physical vapor deposition, atomic layer deposition, or the like, and may be deposited to a thickness of between about 10 Å and about 200 Å, such as about 40 Å. However, any suitable process of formation and thickness may be utilized.

Once the third etch stop layer 117 has been formed, the third dielectric layer 119 may be formed. In an embodiment the third dielectric layer 119 may be, e.g., a low-k dielectric film intended to help isolate interconnects from other structures. By isolating the interconnects, the resistance-capacitance (RC) delay of the interconnects may be reduced, thereby improving the overall efficiency and speed of electricity through the interconnect.

In an embodiment the third dielectric layer 119 may be a porous material such as SiOCN, SiCN or SiOC and may be formed by initially forming a precursor layer over the third etch stop layer 117. The precursor layer may comprise both a matrix material and a porogen interspersed within the matrix material, or may alternatively comprise the matrix material without the porogen. In an embodiment the precursor layer may be formed, e.g., by co-depositing the matrix and the porogen using a process such as plasma enhanced chemical vapor deposition (PECVD) where the matrix material is deposited at the same time as the porogen, thereby forming the precursor layer with the matrix material and the porogen mixed together. However, as one of ordinary skill in the art will recognize, co-deposition using a simultaneous PECVD process is not the only process that may be used to form the precursor layer. Any suitable process, such as premixing the matrix material and the porogen material as a liquid and then spin-coating the mixture onto the third etch stop layer 117, may also be utilized.

The precursor layer may be formed to a thickness sufficient to provide the isolation and routing characteristics that are desired of the third dielectric layer 119. In an embodiment, the precursor layer may be formed to a thickness of between about 10 Å and about 1000 Å, such as about 300 Å. However, these thicknesses are meant to be illustrative only, and are not intended to limit the scope of the embodiments, as the precise thickness of the precursor layer may be any suitable desired thickness.

The matrix material, or base dielectric material, may be formed using a process such as PECVD, although any suitable process, such as a chemical vapor deposition (CVD), physical vapor deposition (PVD), or even spin-on coating, may alternatively be utilized. The PECVD process may utilize precursors such as methyldiethoxy silane (DEMS), although other precursors such as other silanes, alkylsilanes (e.g., trimethylsilane and tetramethylsilane), alkoxysilanes (e.g., methyltriethoxysilane (MTEOS), methyltrimethoxysilane (MTMOS), methyldimethoxysilane (MDMOS), trimethylmethoxysilane (TMMOS) and dimethyldimethoxysilane (DMDMOS)), linear siloxanes and cyclic siloxanes (e.g., octamethylcyclotetrasiloxane (OMCTS) and tetramethylcyclotetrasiloxane (TMCTS)), combinations of these, and the like may alternatively be utilized. However, as one of ordinary skill in the art will recognize, the materials and processes listed herein are merely illustrative and are not meant to be limiting to the embodiments, as any other suitable matrix precursors may alternatively be utilized.

After the precursor layer has been formed with the porogen dispersed within the matrix material, the porogen is removed from the matrix material to form the pores within the matrix material. In an embodiment the removal of the porogen is performed by an annealing process which can break down and vaporize the porogen material, thereby allowing the porogen material to diffuse and leave the matrix material, thereby leaving behind a structurally intact porous dielectric material as the third dielectric layer 119. For example, an anneal of between about 200° C. and about 500° C., such as about 400° C., for between about 10 seconds and about 600 seconds, such as about 200 seconds, may be utilized.

However, as one of ordinary skill in the art will recognize, the thermal process described above is not the only method that may be utilized to remove the porogen from the matrix material to form the third dielectric layer 119. Other suitable processes, such as irradiating the porogen with UV radiation to decompose the porogen or utilizing microwaves to decompose the porogen, may alternatively be utilized. These and any other suitable process to remove all or a portion of the porogen are all fully intended to be included within the scope of the embodiments.

FIG. 1 additionally illustrates a placement of an anti-reflective layer 121. In an embodiment the anti-reflective layer 121 may be a nitrogen-free anti-reflective coating and may comprise a polymer resin, a catalyst, and a cross-linking agent, all of which are placed into a solvent for dispersal. The polymer resin comprises a polymer chain with repeating units, such as a cross-linking monomer and a monomer with chromophore units. In an embodiment the monomer with the chromophore unit may comprise vinyl compounds containing substituted and unsubstituted phenyl, substituted and unsubstituted anthracyl, substituted and unsubstituted phenanthryl, substituted and unsubstituted naphthyl, substituted and unsubstituted heterocyclic rings containing heteroatoms such as oxygen, sulfur, or combinations thereof, such as pyranyl or acridinyl. The substituents in these units may be any hydrocarbyl group and may further contain heteroatoms, such as, oxygen, sulfur or combinations thereof, such as alkylenes, ester, ethers, combinations of these, or the like, with a number of carbon atoms between 1 and 12.

The cross-linking monomer may be used to cross-link the monomer with other polymers within the polymer resin to modify the solubility of the anti-reflective layer 121, and may optionally have an acid labile group. In a particular embodiment the cross-linking monomer may comprise a hydrocarbon chain that also comprises, e.g., a hydroxyl group, a carboxyl acid group, a carboxylic ester group, epoxy groups, urethane groups, amide groups, combinations of the, and the like.

The catalyst may be a compound that is used to generate a chemically active species and initiate a cross-linking reaction between the polymers within the polymer resin and may be, e.g., a thermal acid generator, a photoacid generator, a photobase generator, suitable combinations of these, or the like. In an embodiment in which the catalyst is a thermal acid generator, the catalyst will generate an acid when sufficient heat is applied to the anti-reflective layer 121. Specific examples of the thermal acid generator include butane sulfonic acid, triflic acid, nanoflurobutane sulfonic acid, nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid, combinations of these, or the like.

The cross-linking agent may also be added to the anti-reflective layer 121. The cross-linking agent reacts with the polymers within the polymer resin within the anti-reflective layer 121, assisting in increasing the cross-linking density of the photoresist, which helps to improve the resist pattern and resistance to dry etching. In an embodiment the cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, a polyether polyol, a polyglycidil ether, a vinyl ether, a triazine, combinations of these, or the like.

The materials for the anti-reflective layer 121 may be placed into a solvent for dispersal. In an embodiment the solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Once the material for the anti-reflective layer 121 has been prepared, the material for the anti-reflective layer 121 may be utilized by initially applying the material for the anti-reflective layer 121 onto the third dielectric layer 119. The material for the anti-reflective layer 121 may be applied to the third dielectric layer 119 so that the material for the anti-reflective layer 121 coats an upper exposed surface of the third dielectric layer 119, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the material for the anti-reflective layer 121 may be applied such that it has a thickness of between about 50 nm and about 500 nm, such as about 300 nm.

Once the anti-reflective layer 121 has been formed, a first hardmask 123 may be formed over the anti-reflective layer 121. In an embodiment the first hardmask 123 may be a masking material such as titanium nitride (TiN), although any other suitable material, such as titanium oxide may be used. The first hardmask 123 may be formed using a deposition process such as chemical vapor deposition, physical vapor deposition, atomic layer deposition, combinations of these, or the like, and may be formed to a thickness of between about 50 Å and about 800 Å, such as about 300 Å. However, any suitable thickness may be utilized.

Once formed, the first hardmask 123 may be patterned in order to provide a masking layer for a subsequent etching process (e.g. a first etching process 127 described below) to form a via opening 120. In an embodiment the first hardmask 123 may be patterned by placing a first photoresist 125 over the first hardmask 123 and then exposing and developing the first photoresist 125 to form a patterned photoresist. In an embodiment the first photoresist 125 is a tri-layer photoresist, with a bottom anti-reflective coating (BARC) layer, an intermediate mask layer, and a top photoresist layer (not separately illustrated within FIG. 1). However, any suitable type of photosensitive material or combination of materials may be utilized. Once the first photoresist 125 has been patterned, the pattern of the first photoresist 125 is then transferred to the first hardmask 123 using, e.g., an anisotropic etching process such as a reactive ion etching process. However, any suitable process may be utilized.

Once the first hardmask 123 has been patterned, the pattern of the first hardmask 123 may be transferred to the third dielectric layer 119 using a first etching process (represented in FIG. 1 by the wavy lines labeled 127). In an embodiment the first etching process 127 may be, e.g., an anisotropic etching process such as a reactive ion etch with etchants suitable to etch the third dielectric layer 119. However, any suitable etching method or combination of etching methods may be utilized.

By using the first etch process 127 and the first hardmask 123, the pattern of the first hardmask 123 is transferred to the anti-reflective layer 121 and then to the third dielectric layer 119 and the via opening 120 is formed. In an embodiment the transfer of the pattern from the first hardmask 123 into the third dielectric layer 119 helps to form a via portion of an interconnect 503 (not illustrated in FIG. 1 but illustrated and discussed further below with respect to FIG. 5) into the third dielectric layer 119. In a particular embodiment, the via portion of the interconnect 503 may be formed by the first etch process 127 to extend into the third dielectric layer 119, but not through the third dielectric layer 119.

Figure 2:
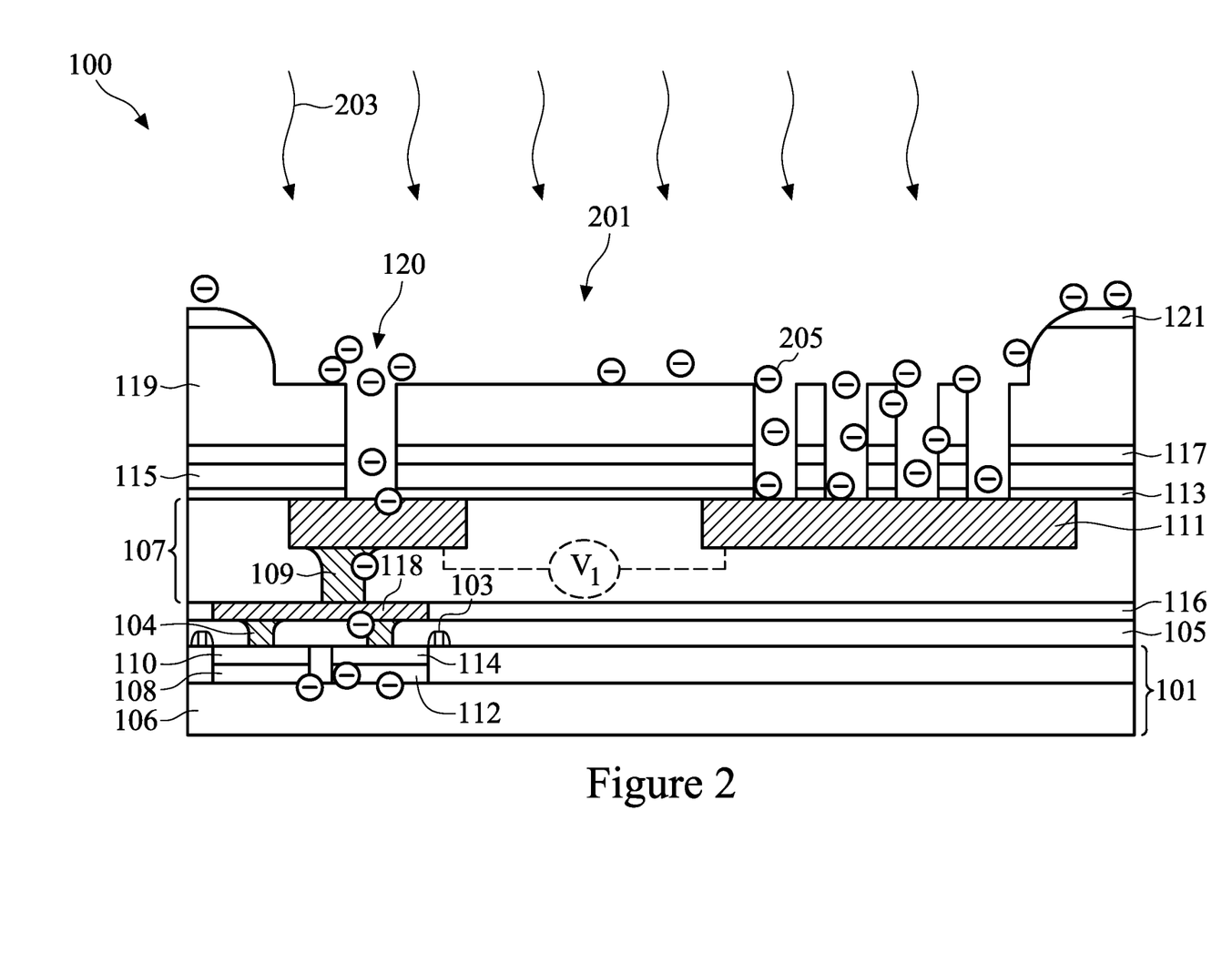
FIG. 2 illustrates a formation of trench openings in accordance with some embodiments.

FIG. 2 illustrates that, once the via opening 120 has been formed, the first photoresist 125 is removed. In an embodiment the first photoresist 125 is removed using a process such as ashing, whereby the temperature of the first photoresist 125 is increased until the first photoresist 125 experiences a thermal decomposition, at which point the first photoresist 125 may be easily removed. However, any other suitable process, such as a wet or dry etch, or even removing the first photoresist 125 using the same etching process that forms the via opening 120, may be used.

Additionally, after the first photoresist 125 has been removed, the first hardmask 123 may be removed. In an embodiment the first hardmask 123 may be removed using, e.g., a wet etchant selective to the material of the first hardmask 123. However, any suitable process for removing the first hardmask 123 may be utilized.

Once the first photoresist 125 has been removed, a second photoresist (not separately illustrated) may be deposited and patterned to form openings to assist in the patterning of trench openings 201. In an embodiment the second photoresist is a tri-layer photoresist, with a bottom anti-reflective coating (BARC) layer, an intermediate mask layer, and a top photoresist layer (not separately illustrated within FIG. 2). However, any suitable type of photosensitive material or combination of materials may be utilized.

Once the second photoresist has been placed over the first hardmask 123 and the via opening 120, the second photoresist is patterned. In an embodiment the second photoresist may be patterned by exposing a photosensitive material within the second photoresist (e.g., the top photoresist layer in the tri-layer photoresist) to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the second photoresist are different from the physical properties of the unexposed portions of the second photoresist. The second photoresist may then be developed with, e.g., a developer (not separately illustrated), in order to separate the exposed portion of the second photoresist from the unexposed portion of the second photoresist, and the pattern of the top photoresist layer may be extended through the intermediate mask layer and the bottom anti-reflective coating layer.

Once the second photoresist has been placed and patterned, a second etching process (represented in FIG. 2 by the wavy lines labeled 203) may be used to form trench openings 201. In an embodiment the second etching process 203 may be similar to the first etching process 127. For example, the second etching process 203 may be an anisotropic etching process such as a reactive ion etching process that utilizes etchants that are selective to the third dielectric layer 119.

The second etching process 203 will work to form the trench openings 201 and also to extend the via opening 120 all of the way through the third dielectric layer 119 and will expose the underlying third etch stop layer 117, which material is chosen to stop or at least slow down the second etching process 203 and prevent the second etching process 203 from etching past the third etch stop layer 117. As such, the via openings 120 may extend into, but not through, the third etch stop layer 117.

FIG. 2 additionally illustrates that the via openings 120 may be extended through the third etch stop layer 117 and the second etch stop layer 115. In an embodiment the breakthrough of the via openings 120 through the third etch stop layer 117 and the second etch stop layer 115 is performed with one or more wet etching processes in which liquid etchants are brought into contact with the third etch stop layer 117 and then the second etch stop layer 115.

After the third etch stop layer 117 and the second etch stop layer 115 have been patterned to extend the via openings 120, the via openings 120 may be extended through the first etch stop layer 113. In an embodiment the extension of the via openings 120 through the first etch stop layer 113 exposes the underlying conductive material within the first trenches 111, and may be performed using, e.g., a wet or dry etching process, although any suitable method may be utilized.

For example, in one embodiment the extension of the via openings 120 will expose multiple portions of the conductive material within the first trenches 111. In one embodiment, a first portion of the conductive material within the first trenches 111 is electrically connected to the semiconductor substrate 101, such as by being electrically connected through the contact plug 104 to one of the active devices 103. Further, another portion of the conductive material within the first trenches 111 that is exposed is not electrically connected, and may be electrically isolated, from the active regions within the semiconductor substrate 101. However, any suitable combination of regions connected and not connected to the active regions may be utilized, including combinations where both exposed portions are connected and combinations where both exposed portions are not connected to the semiconductor substrate 101.

Once the conductive material within the first trenches 111 have been exposed, a corner rounding/liner removal may be performed in order to round the corners of the via openings 120 and the trench openings 201 and also remove any material from the third dielectric layer 119 that may have entered the trench openings 201 and via openings 120. In an embodiment the corner rounding/liner removal may be performed using an etching process such as a dry etch. For example, in an embodiment the corner rounding/liner removal dry etch may clean the openings as well as at least partially round the corners of the via openings 120 and the trench openings 201. However, any suitable process may be used.

FIG. 2 additionally illustrates a charge distribution that can occur after the formation of the first trenches openings 201 and the corner rounding/liner removal. In particular, after the dry etching processes, most of the charges 205 are trapped either on the surface of the third dielectric layer 119 or else within the via openings 120 that expose surfaces which do not have an electrical connection to the underlying active areas (e.g., which do not have an electrical connection to the OD regions of the first conductive region 110 and the second conductive region 114). Additionally, while there may be some charges 205 that are within the via openings 120 which expose surfaces which do have an electrical connection to the underlying active areas, these charges 205 are lesser charges. Such a difference in charge distribution causes a first surface potential difference ($V_1$) between the portion of the conductive material within the first trenches 111 that is connected to the semiconductor substrate 101 (e.g., through contact plugs 104 to the first conductive region 110 and the second conductive region 114) and the portion of the conductive material within the first trenches 111 that is not connected to the semiconductor substrate 101. In some embodiments the first surface potential difference $V_1$ may be between about 0.01 V and about 20 V, such as about 8.271 V, when measured using a FAaST-300SL tool from SEMI-LAB.

However, such a first surface potential difference can have detrimental effects during subsequent processing. For example, during subsequent cleaning processes, the difference in surface potential can cause a galvanic corrosion effect, whereby an electrochemical reaction occurs such that conductive material within the first trenches 111 that is connected to the semiconductor substrate 101 (e.g., copper) is corroded (to cause a copper recess) and then released or rearranged towards the conductive material within the first trenches 111 that is not connected to the semiconductor substrate 101, causing a copper extrusion to form. When the first well 108 and the first conductive region 110 are utilized to form a photodiode, this effect is known as a photodiode induced copper redeposition (PICR), although the issue is not limited to photodiodes. Accordingly, during subsequent gap filling processes, the recesses formed by the galvanic corrosion may result in either a high contact resistance or even an open circuit, which can reduce performance and yield.

Figure 3:
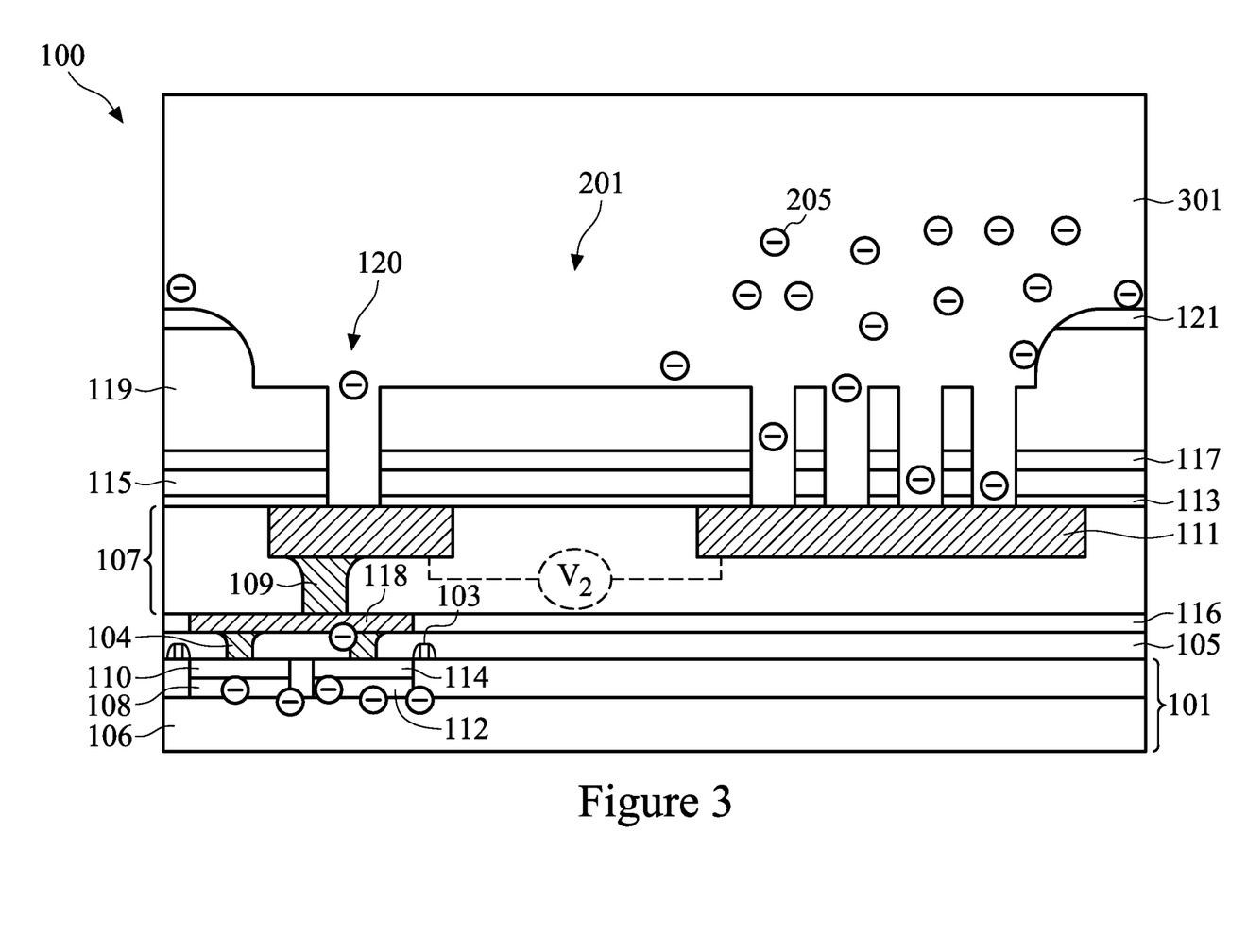
FIG. 3 illustrates an application of a first treatment chemical in accordance with some embodiments.

FIG. 3 illustrates a treatment which is utilized to release the charges 205 within the via openings 120 and reduce the potential difference between the conductive material within the first trenches 111. In an embodiment the treatment may be performed by applying a first treatment chemical 301 onto the exposed surfaces and within the trench openings 201 and the via openings 120. The first treatment chemical 301 is utilized to release the charges 205 on the surfaces and reduce the potential difference to a second surface potential difference $V_2$ which is less than the first surface potential difference $V_1$. In some embodiments the second surface potential difference $V_2$ may be between about 0.01 V and about 20 V, such as about 3.776 V.

Optionally, prior to the application of the first treatment chemical 301, a pre-rinse may be performed. In an embodiment the pre-rinse may be performed by dispensing a rinsing solution, such as deionized water, onto the exposed surfaces for a time period of between about 1 second and about 5 seconds, such as about 3 seconds. However, any suitable process conditions may be utilized.

In an embodiment the first treatment chemical 301 has a low conductivity, such as a conductivity within the range of deionized water and is either inert or minimally reactive to the exposed surfaces, such as the exposed surfaces of the third dielectric layer 119. For example, the first treatment chemical 301 may have a conductivity between about 0.005 µS/cm and about 100.0 µS/cm, such as between about 0.055 µS/cm and about 40.0 µS/cm. Additionally, the first treatment chemical 301 may be volatile such as evaporating more quickly than water, and does not result in an oxidation-reduction reaction with the exposed surfaces. For example, in particular embodiments the first treatment chemical 301 may be isopropyl alcohol (IPA), hexane, acetone, dilute ammonium, mixtures of these, or the like. However, any suitable first treatment chemical 301 may be utilized.

In an embodiment the first treatment chemical 301 may be applied using a process such as a spin-on process or a dip process, although any suitable process for applying the first treatment chemical 301 may be used. In an embodiment in which the first treatment chemical 301 is applied using a spin-on process, the first treatment chemical 301 may be applied at a flow rate of between about 50 ml/minute to about 5 liters/minute, such as about 135 ml/min. Additionally, the first treatment chemical 301 may be applied at a temperature of between about 10° C. and about 80° C., such as about 25° C., and for a time of between about 5 seconds and about 48 seconds, such as about 15 seconds. However, any suitable process conditions can be used.

By applying the first treatment chemical 301, the charges 205 located on the exposed surfaces and within the via openings 120 and trench opening 201 are released and removed into the first treatment chemical 301. As such, in one embodiment the exposed surfaces are modified to form a surface which is charge-neutral. In another embodiment, the application of the first treatment chemical 301 does not form a charge-neutral surface, but modifies the surfaces such that the second surface potential difference $V_2$ is less than the first surface potential difference $V_1$.

By treating the surface and either reducing the surface potential difference or eliminating the surface potential difference (e.g., forming neutral surfaces), the negative effects of the surface potential difference can be reduced or eliminated. For example, by reducing the surface potential difference, the galvanic corrosion can be lessened. This is especially true when the surface potential difference can be reduced to a point below the oxidation-reduction potential of the conductive material within the first trenches 111 (e.g., copper), such that an oxidation-reduction reaction will not occur. By reducing these effects, the interconnection performance, reliability and yield can be improved, such that the failure rate percentage due to copper extrusion defects can be reduced from about 30% to about 0%, including a failure rate of 0%.

For example, in an embodiment in which IPA is utilized as the first treatment chemical 301, the increase in contact resistance brought about by galvanic effects can be reduced from about a 58% increase (without the usage of the IPA) to an increase of only 3% (with a rinse of between about 4 minutes) or even 2% (with a rinse of between about 2 minutes).

Figure 4:
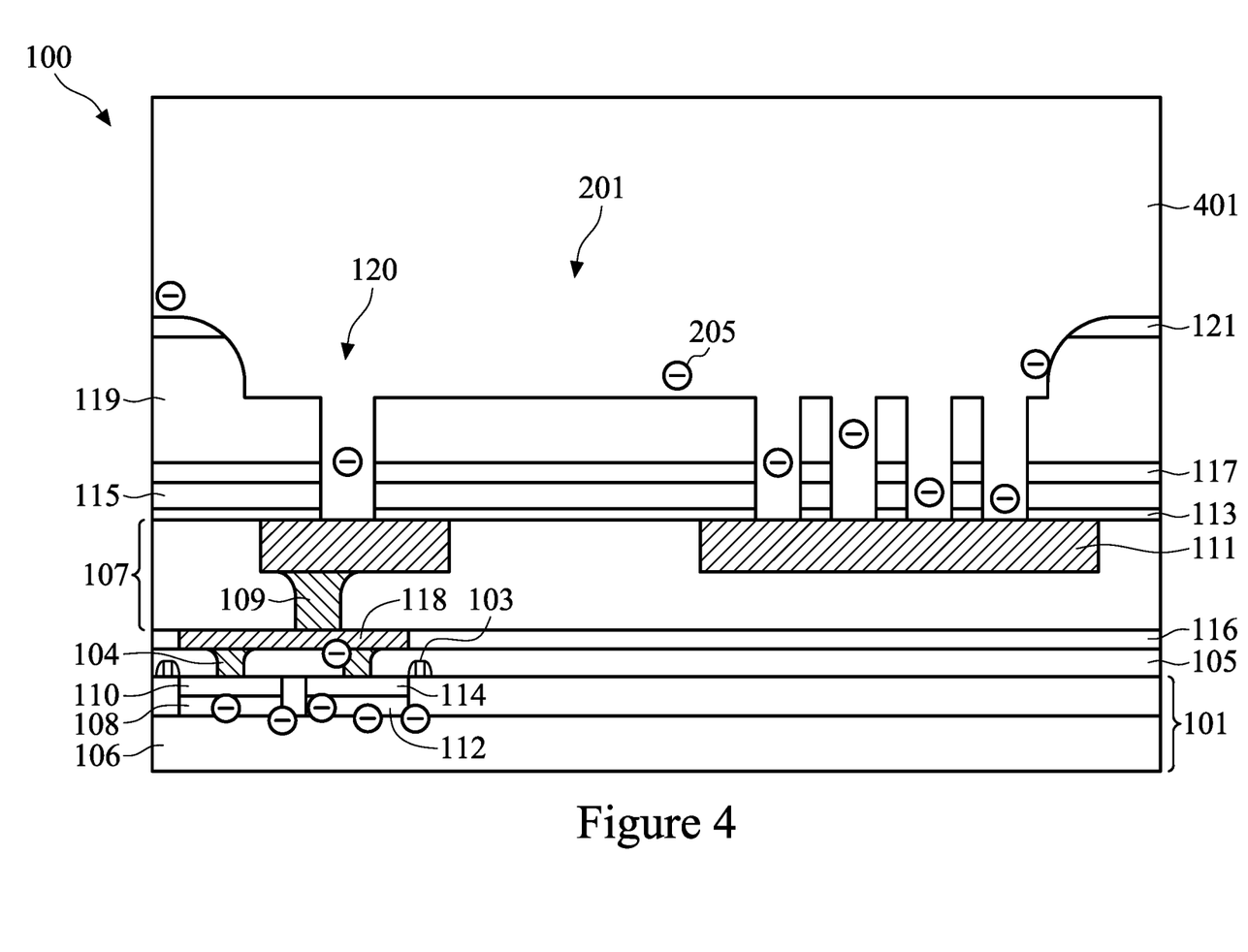
FIG. 4 illustrates an application of a cleaning solution in accordance with some embodiments.

FIG. 4 illustrates that, once the first treatment chemical 301 has been applied and removed, a cleaning process is utilized to help clean the exposed surfaces of the conductive materials within the first trenches 111 (e.g., copper). In an embodiment the cleaning process may be performed by applying, in sequence, a first cleaning solution 401 and a post-rinsing solution (also not separately illustrated in FIG. 4) onto the exposed surfaces within the trench opening 201 and the via openings 120.

The first cleaning solution 401 is utilized in order to remove residues from within the via opening 120 and the trench opening 201 and, as such, is at least partially dependent upon the materials and products utilized during the previous processes. However, in an embodiment in which the third etch stop layer 117 is aluminum oxynitride and the conductive material within the first trenches 111 is copper, the first cleaning solution 401 may be a solution comprising an oxidizer and a solvent.

For example, in an embodiment the oxidizer may be hydrogen peroxide, although any other suitable oxidizer may also be used. In an embodiment the oxidizer may be placed within the solution at a suitable concentration, such as a concentration of between about 0.1%-wt and about 25%-wt, such as about 1.25%-wt. However, any suitable concentration may be utilized.

The organic solvent is utilized to dilute and deliver the oxidizer. In an embodiment the organic solvent may be an organic liquid such as ethylene glycol, propylene glycol monomethyl ether, diethylene glycol monoethyl ether, diethylene glycol monobutyl ether, tetrahydrothiophene-1,1-dioxide, dimethylsulfoxide, N—N-dimethylacetamide, 4-methylmorpholine, 4-methylmorpholine N-oxide, 4-methoxypyridine-N-oxide hydrate, ammonium hydroxide, tetramethyl ammonium hydroxide, tetraethylammonium hydroxide, mixtures of these, or the like. The organic solvent may be within the solution at any concentration such as a concentration of between about 10%-wt and about 70%-wt, such as about 49%-wt. However, any suitable concentration may be utilized.

Optionally, other additives may be placed into the solution for the first cleaning solution 401. For example, an inhibitor may be placed into the first cleaning solution 401 in order to better control the etching characteristics of the first cleaning solution 401. For example, an inhibitor such as benzotriazole (BTA), a mixture of 4- and 5-carboxy benzotriazole (CBTA), 5-Aminotetrazole (5-ATA), 1,2,4-triazole (TAZ), Ethylenediaminetetraacetic acid (EDTA), Diethylenetriamin-pentaacetic acid (DPTA) and relative derivatives may be used at a concentration of between about 0.05%-wt and about 5%-wt, such as about 1.4%-wt. However, any suitable additives at any suitable concentration may be added to the first cleaning solution 401.

In an embodiment the first cleaning solution 401 may be applied using a process such as a spin-on process or a dip process, although any suitable process for applying the first cleaning solution 401 may be used. Additionally, the first cleaning solution 401 may be applied at a temperature of between about 20° C. and about 80° C., such as about 59° C. However, any suitable process conditions can be used.

Additionally, by utilizing the first treatment chemical 301 as described above with respect to FIG. 3, the time that can be utilized for the first cleaning solution 401 may be reduced. For example, in an embodiment in which the first treatment chemical 301 is utilized, the time of usage for the first cleaning solution 401 may be performed for a time of about 2 minutes to about 4 minutes. However, any suitable time may be utilized.

By reducing the amount of time that the first treatment chemical 301 is applied, the negative effects of the first treatment chemical 301 may be reduced or minimized, especially along an edge of the semiconductor substrate 101 (e.g., wafer edge). For example, in embodiments in which the first trenches 111 are formed to have a width of 180 nm, longer treatment times (e.g., about 4 minutes) may cause undesired copper recesses with a depth of about 6.18 nm along the edges of the semiconductor substrate 101 (e.g., wafer edges). However, by reducing the time to about 2 minutes, the recess may be reduced to a depth of 2.65 nm (with a post-rinsing solution time, described further below, of about 20 seconds).

By reducing the recess depth that results from the use of the first cleaning solution 401, the overall failure rate (F/R) can be significantly reduced. For example, for a conductive material having a width of 0.02 μm, the failure rate after manufacture is reduced from 24% to about 5%, while, after a time of 168 hours in an environment of 200° C., the failure rate is reduced from 29% to about 5%. Additionally, for a conductive material having a width of 0.27 μm, the failure rate after manufacture is reduced from 53% to about 7% while, after a time of 5 s, the failure rate is reduced from 24% to about 7%.

Optionally, once the first cleaning solution 401 has been utilized, a post-rinsing solution may be applied. In an embodiment the post-rinsing solution may be a rinsing solution, such as deionized water, although any suitable rinsing solution to remove remaining residue from the first cleaning solution may be utilized. The post-rinsing solution may be applied for less than about 60 seconds, such as about 20 seconds, 10 seconds, 9 seconds, 6 seconds, 3 seconds, or even 1 second. However, any suitable time may be utilized.

For example, in an embodiment in which the conductive material within the trenches 111 have a width of about 0.04 μm (and the via opening is about 0.02 μm), the application of the first treatment chemical 301 is done for about 5 seconds, and the first cleaning solution 401 is applied for about 2 minutes, the post-rinsing solution may be applied for a time of less than about 12 seconds, such as about 9 seconds, 6 seconds, 1 second, or even forego the application of the first cleaning solution 401 altogether. In these embodiments, the recess within the conductive material within the trenches 111 may be recessed an amount of about 3.98 nm (for 12 seconds), 2.13 nm (for 9 seconds), 3.31 nm (for 6 seconds), or even less than 1 nm, such as 0.62 nm (for 1 second or no rinse). Additionally, if deionized water is utilized as a rinse for one second prior to the application of the first treatment chemical 301, the use of the post-rinsing solution can result in a recess of about 3.33 nm (for a 6 second rinse) or a recess of about 5.66 nm (for a 15 second rinse).

In another embodiment in which the conductive material within the trenches 111 have a width of about 0.8 μm (and the via opening is about 0.02 μm), the application of the first treatment chemical 301 is done for about 5 seconds, and the first cleaning solution 401 is applied for about 2 minutes, the post-rinsing solution may be applied for a time of less than about 12 seconds, such as about 9 seconds, 6 seconds, 3 seconds, or even forego the application of the first cleaning solution 401 altogether. In these embodiments, the recess within the conductive material within the trenches 111 may be recessed an amount of about 2.88 nm (for 9 seconds), 2.59 nm (for 6 seconds), 2.52 nm (for 3 seconds), or 1.42 (for no post-rinsing solution). Additionally, if deionized water is utilized as a rinse for one second prior to the application of the first treatment chemical 301, the use of the post-rinsing solution can result in a recess of about 6.41 nm (for a 12 second rinse) or a recess of about 5.66 nm (for a 15 second rinse) or a recess of about 4.84 nm (for a 6 second rinse).

Figure 5:
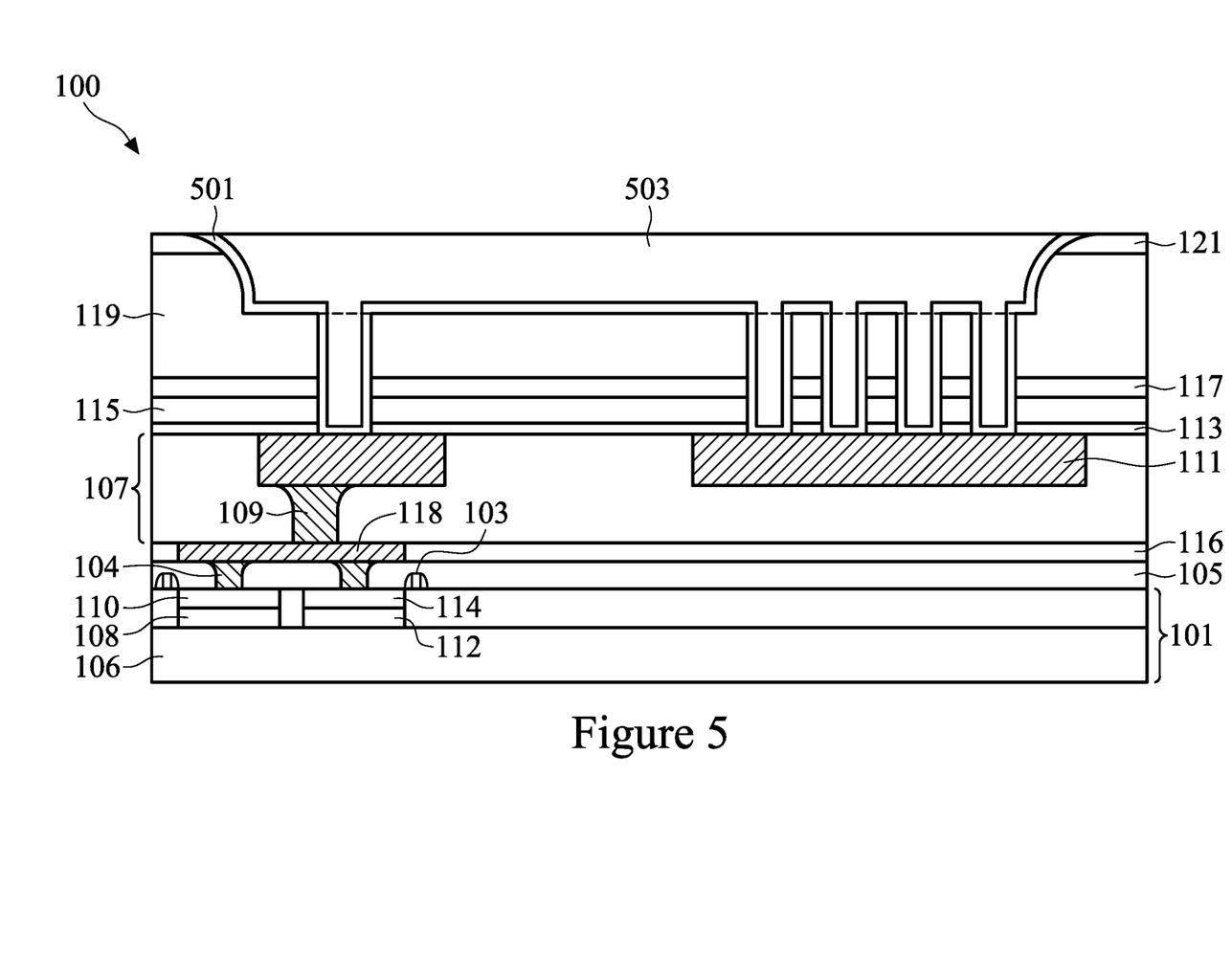
FIG. 5 illustrates a filling of the via openings and trench openings in accordance with some embodiments.

FIG. 5 illustrates that, after the first cleaning solution 401 has been applied and removed, a first barrier layer 501 may be deposited in order to help isolate and protect a subsequently formed conductive material (discussed further below). In an embodiment the first barrier layer 501 may comprise a barrier material such as titanium, titanium nitride, combinations of these, or the like, and may be formed using a process such as chemical vapor deposition (CVD), physical vapor deposition (PVD), atomic layer deposition (ALD), or the like. The first barrier layer 501 may be formed to have a thickness of between about 0.1 μm and about 20 μm, such as about 0.5 μm.

Once the first barrier layer 501 has been formed to line the trench openings 201 and the via openings 120, the trench openings 201 and the via openings 120 are filled with a conductive material to form the interconnect 503 with a via portion (within the via openings 120) and the trench portion (within the trench opening 201, and illustrated as being separated from the via portion using a dashed line, although there may or may not be a physical indication of the separation). The conductive material may comprise copper, although other suitable materials such as aluminum, alloys, doped polysilicon, combinations thereof, and the like, may alternatively be utilized. The conductive material may be formed by depositing a seed layer (not separately illustrated), electroplating copper onto the seed layer, and filling and overfilling the trench openings 201 and the via opening 120. Once the trench openings 201 and the via opening 120 have been filled, excess portions of the first barrier layer 501, the seed layer, and conductive material outside of the trench openings 201 and the via opening 120 may be removed through a planarization process such as chemical mechanical polishing (CMP), although any suitable removal process may be used.

In an embodiment, a method of manufacturing a semiconductor device comprises forming an opening within a first dielectric layer to expose a first conductive region and a second conductive region; and reducing a surface potential difference between the first conductive region and the second conductive region. In an embodiment, the opening comprises a via portion and a trench portion. In an embodiment, the first conductive region is electrically connected to an active area of a semiconductor substrate and wherein the second conductive region is electrically isolated from the active area. In an embodiment, the reducing the surface potential difference reduces the surface potential difference to a value below an oxidation reduction potential of a material of the first conductive region. In an embodiment, the material of the first conductive region comprises copper. In an embodiment, the reducing the surface potential difference comprises applying a first treatment chemical. In an embodiment, the first treatment chemical comprises hexane.

In an embodiment, a method of manufacturing a semiconductor device comprises forming a first via opening within a low-k dielectric layer; forming a first trench opening within the low-k dielectric layer, wherein the forming the first trench opening extends the first via opening through the low-k dielectric layer; applying a treatment chemical within the first via opening and the first trench opening, wherein the treatment chemical releases surface charges from within the first via opening and the first trench opening. In an embodiment, the method further comprises performing a liner removal process after the forming the first trench opening and prior to the applying the treatment chemical. In an embodiment, the method further comprises cleaning the first via opening and the first trench opening after the applying the treatment chemical. In an embodiment, the cleaning the first via opening and the first trench opening comprises applying a cleaning solution different from the treatment chemical. In an embodiment, the cleaning solution comprises an oxidant and an organic solvent. In an embodiment, the forming the first via opening forms a second via opening separated from the first via opening. In an embodiment, the first via opening exposes a conductive region electrically connected to an active area of a semiconductor substrate and wherein the second via opening exposes a conductive region electrically isolated from the active area of the semiconductor substrate.

In an embodiment, a method of manufacturing a semiconductor device comprises depositing a low-k dielectric layer over a substrate; forming a first opening in the low-k dielectric layer; performing a liner removal process after the forming the first opening; applying a first treatment chemical, the first treatment chemical being volatile and having a low conductivity; cleaning the first opening with a first cleaning solution different from the first treatment chemical, the cleaning the first opening being performed after a removal of the first treatment chemical; after the cleaning the first opening, rinsing the first opening; and filling the first opening with a conductive material. In an embodiment, the first treatment chemical comprises hexane. In an embodiment, the first treatment chemical comprises isopropyl alcohol. In an embodiment, the first treatment chemical comprises acetone. In an embodiment, the first cleaning solution comprises an oxidant. In an embodiment, the rinsing the first opening comprises rinsing the first opening with deionized water.

In an embodiment, a method of manufacturing a semiconductor device comprises depositing a dielectric material onto a substrate; forming an opening through the dielectric material, wherein the opening comprises a via portion and a trench portion; pre-rinsing the via portion and the trench portion with a first liquid; treating the via portion and the trench portion with a second liquid different from the first liquid, wherein the treating the via portion and the trench portion reduces a surface potential difference to a value below an oxidation-reduction potential of one of the exposed surfaces of the via portion; cleaning the via portion and the trench portion with a third liquid different from the first liquid and the second liquid, the third liquid comprising an oxidant; post-rinsing the via portion and the trench portion with a fourth liquid different from the third liquid. In an embodiment, the cleaning the via portion and the trench portion is performed for a time of less than or equal to about 2 minutes. In an embodiment, the post-rinsing the via portion and the trench portion is performed for a time of less than or equal to 12 seconds. In an embodiment, the post-rinsing the via portion and the trench portion is performed for a time of less than or equal to 9 seconds. In an embodiment, the post-rinsing the via portion and the trench portion is performed for a time of less than or equal to 6 seconds. In an embodiment, the post-rinsing the via portion and the trench portion is performed for a time of less than or equal to 1 second. In an embodiment, the first liquid and the fourth liquid are both deionized water.

In an embodiment, a method of manufacturing a semiconductor device comprises depositing first etch stop layer over a first conductive element and a second conductive element, wherein the first conductive element is electrically connected to an active region of a semiconductor substrate and the second conductive element is not electrically connected to the semiconductor substrate; depositing a second etch stop layer over the first etch stop layer; depositing a third etch stop layer over the second etch stop layer; depositing a low-k dielectric layer over the third etch stop layer; forming a first via opening through the low-k dielectric layer, the third etch stop layer, the second etch stop layer, and the first etch stop layer to expose the first conductive element; forming a second via opening through the low-k dielectric layer, the third etch stop layer, the second etch stop layer, and the first etch stop layer to expose the second conductive element; applying a volatile liquid with a low conductivity to release built up charges from the first via opening and the second via opening to a point wherein a surface charge difference between the first conductive element and the second conductive element is below an oxidation-reduction potential of a material of the first conductive element; applying a cleaning solution to the first via opening and the second via opening for no more than about two seconds, wherein the cleaning solution comprises an oxidant; and applying a rinsing liquid to the first via opening and the second via opening for less than about twelve seconds. In an embodiment, the volatile liquid is hexane. In an embodiment, the rinsing liquid is deionized water. In an embodiment, the volatile liquid is isopropyl alcohol. In an embodiment, the first etch stop layer is aluminum nitride. In an embodiment, the second etch stop layer is an oxide. In an embodiment, the third etch stop layer is aluminum oxide.

In an embodiment, a semiconductor device comprises a first conductive element within a substrate; a low-k dielectric layer over the first conductive element; a via opening extending through the low-k dielectric layer, wherein the via opening exposes the first conductive element; and a recess within the first conductive element exposed by the via opening, wherein the recess has a first depth no larger than 1 nm. In an embodiment, the first conductive element comprises copper. In an embodiment, the semiconductor device comprises a conductive material filling the via opening. In an embodiment, the first conductive element comprises tungsten. In an embodiment, the first conductive element comprises titanium dioxide. In an embodiment, the first conductive element comprises ruthenium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    depositing a dielectric material onto a substrate;
    forming an opening through the dielectric material, wherein the opening comprises a via portion and a trench portion;
    pre-rinsing the via portion and the trench portion with a first liquid;
    treating the via portion and the trench portion with a second liquid different from the first liquid, wherein the treating the via portion and the trench portion reduces a surface potential difference to a value below an oxidation-reduction potential of one of the exposed surfaces of the via portion;
    cleaning the via portion and the trench portion with a third liquid different from the first liquid and the second liquid, the third liquid comprising an oxidant; and
    post-rinsing the via portion and the trench portion with a fourth liquid different from the third liquid.

2. The method of claim 1, wherein the cleaning the via portion and the trench portion is performed for a time of less than or equal to about 2 minutes.

3. The method of claim 2, wherein the post-rinsing the via portion and the trench portion is performed for a time of less than or equal to 12 seconds.

4. The method of claim 3, wherein the post-rinsing the via portion and the trench portion is performed for a time of less than or equal to 9 seconds.

5. The method of claim 4, wherein the post-rinsing the via portion and the trench portion is performed for a time of less than or equal to 6 seconds.

6. The method of claim 1, wherein the post-rinsing the via portion and the trench portion is performed for a time of less than or equal to 1 second.

7. The method of claim 1, wherein the first liquid and the fourth liquid are both deionized water.

8. A method of manufacturing a semiconductor device, the method comprising:
    depositing a first etch stop layer over a first conductive element and a second conductive element, wherein the first conductive element is electrically connected to an active region of a semiconductor substrate and the second conductive element is not electrically connected to the semiconductor substrate;
    depositing a second etch stop layer over the first etch stop layer;
    depositing a third etch stop layer over the second etch stop layer;
    depositing a low-k dielectric layer over the third etch stop layer;
    forming a first via opening through the low-k dielectric layer, the third etch stop layer, the second etch stop layer, and the first etch stop layer to expose the first conductive element;
    forming a second via opening through the low-k dielectric layer, the third etch stop layer, the second etch stop layer, and the first etch stop layer to expose the second conductive element;
    applying a volatile liquid with a low conductivity to release built up charges from the first via opening and the second via opening to a point wherein a surface charge difference between the first conductive element and the second conductive element is below an oxidation-reduction potential of a material of the first conductive element;
    applying a cleaning solution to the first via opening and the second via opening for no more than about two seconds, wherein the cleaning solution comprises an oxidant; and
    applying a rinsing liquid to the first via opening and the second via opening for less than about twelve seconds.

9. The method of claim 8, wherein the volatile liquid is hexane.

10. The method of claim 8, wherein the rinsing liquid is deionized water.

11. The method of claim 8, wherein the volatile liquid is isopropyl alcohol.

12. The method of claim 8, wherein the first etch stop layer is aluminum nitride.

13. The method of claim 12, wherein the second etch stop layer is an oxide.

14. The method of claim 13, wherein the third etch stop layer is aluminum oxide.

15. A semiconductor device comprising:
    a first conductive element within a substrate;

a first dielectric etch stop layer overlying and in physical contact with the first conductive element;
a low-k dielectric layer over the first dielectric etch stop layer;
a first via opening extending through the low-k dielectric layer, wherein the first via opening exposes a first portion of the first conductive element;
a second via opening extending through the low-k dielectric layer, wherein the second via opening exposes a second portion of the first conductive element, wherein the first conductive element extends continuously between the first portion and the second portion, wherein parts of both the first dielectric etch stop layer and the low-k dielectric layer are located between the first via opening and the second via opening;
a recess within the first conductive element exposed by the first via opening, wherein the recess has a first depth no larger than 1 nm; and
a third via opening extending through the low-k dielectric layer, wherein the third via opening exposes a second conductive element within the substrate, the second conductive element being electrically connected to an active device.

16. The semiconductor device of claim 15, wherein the first conductive element comprises copper.

17. The semiconductor device of claim 15, further comprising a conductive material filling the first via opening.

18. The semiconductor device of claim 15, wherein the first conductive element comprises tungsten.

19. The semiconductor device of claim 15, wherein the first conductive element comprises titanium dioxide.

20. The semiconductor device of claim 15, wherein the first conductive element comprises ruthenium.

* * * * *